United States Patent
Yamada et al.

(10) Patent No.: US 7,420,600 B2
(45) Date of Patent: Sep. 2, 2008

(54) PHOTOELECTRIC CONVERSION APPARATUS WITH CIRCUITRY TO OFFSET DARK NOISE

(75) Inventors: Nobuyuki Yamada, Kyoto (JP); Kenji Yamamoto, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 188 days.

(21) Appl. No.: 10/569,794

(22) PCT Filed: Aug. 25, 2004

(86) PCT No.: PCT/JP2004/012593

§ 371 (c)(1),
(2), (4) Date: Sep. 22, 2006

(87) PCT Pub. No.: WO2005/022903

PCT Pub. Date: Mar. 10, 2005

(65) Prior Publication Data

US 2007/0008592 A1   Jan. 11, 2007

(30) Foreign Application Priority Data

Aug. 29, 2003 (JP) .............................. 2003-307706

(51) Int. Cl.
H04N 5/335 (2006.01)
H04N 9/77 (2006.01)
(52) U.S. Cl. ...................................... 348/243; 348/308
(58) Field of Classification Search .................. 348/243, 348/308
See application file for complete search history.

(56) References Cited

U.S. PATENT DOCUMENTS 5,162,912 A * 11/1992 Ueno et al. .................. 348/241
5,831,675 A * 11/1998 Ueno .......................... 348/302
6,483,541 B1 * 11/2002 Yonemoto et al. ........... 348/302

FOREIGN PATENT DOCUMENTS

| JP | 08-255027 | 10/1996 |
|----|-----------|---------|
| JP | 09-205588 | 8/1997 |
| JP | 10-145681 | 5/1998 |
| JP | 2002-232786 | 8/2002 |

OTHER PUBLICATIONS

JPO Machine Translation of JP 10-145681 cited on the IDS filed Feb. 27, 2008, 1998, 12 pages.*

* cited by examiner

*Primary Examiner*—Evan Pert
(74) *Attorney, Agent, or Firm*—Morgan, Lewis & Bockius LLP

(57) ABSTRACT

The invention relates to a technique removing a dark voltage noise signal occurring at the time of light shielding of a photoelectric conversion device, simplifying the system configuration such that the cost and occupying area is reduced, and suppressing variation among a plurality of buffer amplifiers. In order to obtain such a photoelectric conversion device, a photoelectric conversion element 1 includes: a first accumulating unit 6 that accumulates an output signal outcoming from the photoelectric conversion element during a first period; a second accumulating unit 7 that accumulates an output signal outcoming from the photoelectric conversion element during a second period different from the first period; first and second switch units 4 and 5 used for selectively introducing the output signal from the photoelectric conversion element 1 to the first or second accumulating unit; and an output unit that outputs output signals from the first and second accumulating units 6 and 7 by inversing the polarity of the first accumulating unit 6.

7 Claims, 5 Drawing Sheets

PHOTOELECTRIC CONVERSION APPARATUS WITH CIRCUITRY TO OFFSET DARK NOISE

TECHNICAL FIELD

The present invention relates to a photoelectric conversion device that is used for a facsimile, a copier, a digital camera, etc., and can remove dark voltage noise occurring at the time of shielding light.

BACKGROUND ART

In general, a CCD is mainly used as an image sensor for a facsimile, a copier, a digital camera, etc., but in recent years, an amplification type photoelectric conversion device that includes an amplifying element such as a MOS transistor or a bipolar transistor in each pixel unit has been used. In an amplification type photoelectric conversion device, it is important to remove noise in order to read a signal with high sensitivity.

FIG. 6 shows an example of an amplification type photoelectric conversion device according to the related art. In a photoelectric conversion element 101, even though light is not incident thereon, current flows, which generates noises. Actually, in a case of reading a signal generated by light that is incident onto the photoelectric conversion device 101, it is necessary to remove dark voltage noise and noise caused due to variation of a dark voltage (hereinafter, referred to as a noise signal component). First, in order to output a noise signal component in a case in which light is not incident onto the photoelectric conversion element 101, a selecting unit, which is composed of a MOS transistor 104, is turned on, and through a buffer amplifier 103, a noise signal component, such as electric charge, is accumulated in a noise accumulating unit 106. After elapse of arbitrary accumulation time, the MOS transistor 104 is turned off. Next, the signal generated by the incident light onto the photoelectric conversion element 101 passes through the buffer amplifier 103 while MOS transistor 105 is turned on; thereby charge is accumulated in a signal accumulating unit 107. After an elapse of arbitrary accumulation time, the MOS transistor 105 is turned off.

At this time, electric charge owing to dark voltage noise and electric charge when light is incident are accumulated in the accumulating units 106 and 107, respectively. Then, MOS transistors 110 and 111 are simultaneously turned on and thus the signal components are input to a differential amplifier 114 through buffer amplifiers 112 and 113, respectively. The differential amplifier 114 obtains the difference between the signal components from the accumulating units 107 and 106, and obtains the signal occurring due to a real incident light by removing the noise signal component of the accumulating unit 106. Finally, MOS transistors 108 and 109 are turned on such that charge in the accumulating units 106 and 107 is reset. Further, in order to refresh the remaining charge of the photoelectric conversion element 101, a MOS transistor 102 is turned on such that an offset voltage is applied. In this way, it is possible to remove the noise signal component and to exactly obtain a net signal due to real incident light (refer to, for example, JP-A-9-205588 and JP-A-8-255027).

However, the differential amplifier 114 requires various elements (in particular, at least, eight MOS transistors, one capacitor, and one resistor) as shown in FIG. 5. Therefore, there is a problem in that the area occupied by the differential amplifier does not reduce as the size of the photoelectric conversion device reduces. Further, two buffer amplifiers, that is, the buffer amplifier 112 for dark voltage noise and the buffer amplifier 113 for an optical signal are required. This is a problem in terms of the occupied area. Similar to the differential amplifier, the buffer amplifiers 112 and 113 also generally include a plurality of MOS transistors. Further, in order to make the buffer amplifiers or the differential amplifier function generally with high accuracy, there are cases of using even more elements, whereby it is difficult to disregard the area problem.

Furthermore, variation of an output voltage occurs between two amplifiers, that is, the buffer amplifier 112 for dark voltage noise and the buffer amplifier 113 for an optical signal. Therefore, actually, there is a possibility that the dark voltage noise signal component is not completely removed and thus an exact signal is not read. In particular, the buffer amplifiers 112 and 113 are amplifiers having a feedback amplification factor of 1 and include a plurality of MOS transistors or bipolar transistors. Therefore, property error and deviation of a transistor element due to a manufacturing process of a semiconductor integrated circuit or the like may occur and in particular, the possibility that variation of an output voltage occurs tends to increase as the number of elements increases.

The present invention has been finalized in view of the above-mentioned drawbacks in the related art, and it is an object of the invention to provide a photoelectric conversion device that removes a noise signal component and reads a signal due to incident light, and that reduces the cost and occupied area and removes variation among a plurality of buffer amplifiers by simplifying the system configuration.

DISCLOSURE OF THE INVENTION

The invention claimed in claim 1 provides a photoelectric conversion device including: a photoelectric conversion element; a first accumulating unit that accumulates an output signal outcoming from the photoelectric conversion element during a first period; a second accumulating unit that accumulates an output signal outcoming from the photoelectric conversion element during a second period different from the first period; first and second switch units used for selectively introducing the output signal from the photoelectric conversion element to the first or second accumulating unit; and an output unit that outputs the output signals from the photoelectric conversion element accumulated in the first and second accumulating units at the same time by inversing the polarity of the first accumulating unit.

The invention claimed in claim 2 provides the photoelectric conversion device claimed in claim 1, in which the output unit includes: a third switch unit selectively applying a reference voltage to the connection point between the first witch unit and the first accumulating unit; a fourth switch unit selectively applying a reference voltage to the first and second accumulating units; and a fifth switch unit that is connected to the connection point between the second accumulating unit and the second switch unit and reads signals from the first and second accumulating units.

The invention claimed in claim 3 provides a photoelectric conversion device including: a photoelectric conversion element; a first accumulating unit that accumulates an output signal outcoming from the photoelectric conversion element during a first period; a second accumulating unit that accumulates an output signal outcoming from the photoelectric conversion element during a second period different from the first period; first and second switch units used for selectively introducing the output signal from the photoelectric conversion element to the first or second accumulating unit; a third switch unit selectively applying a reference voltage to the connection point between the first switch unit and the first accumulating unit; a fourth switch unit selectively applying a reference voltage to the first and second accumulating units; and a fifth switch unit that is connected to the connection point between the second accumulating unit and the second switch unit and reads signals from the first and second accumulating units.

The invention claimed in claim 4 provides a photoelectric conversion device including: a photoelectric conversion element; a first accumulating unit that accumulates an output signal outcoming from the photoelectric conversion element during a first period; a second accumulating unit that accumulates an output signal outcoming from the photoelectric conversion element during a second period different from the first period; first and second switch units used for selectively introducing the output signal from the photoelectric conversion element to the first or second accumulating unit; a third switch unit selectively applying a reference voltage to the first accumulating unit when reading; a fourth switch unit selectively applying a reference voltage to the first and second accumulating units when the output signal from the photoelectric conversion element is accumulated; and a fifth switch unit that outputs output signals from the first and second accumulating units at the same time at the time of reading.

The invention claimed in claim 5 provides a photoelectric conversion device which includes: a plurality of photoelectric conversion elements, each forming a pixel, arranged in a matrix; first accumulating units that accumulate output signals outcoming from the photoelectric conversion elements during a first period; second accumulating units that accumulate output signals outcoming from the photoelectric conversion elements during a second period different from the first period; first and second switch units used for selectively introducing the output signals from the photoelectric conversion elements to the first or second accumulating units; third switch units selectively applying a reference voltage to the first accumulating units when reading; fourth switch units selectively applying a reference voltage to the first and second accumulating units when the signals from the photoelectric conversion elements are accumulated; and fifth switch units that output signals from the first and second accumulating units at the same time at the time of reading, and which removes noise for each pixel.

The invention claimed in claim 6 provides the photoelectric conversion device claimed in any one of claims 1 to 5, in which each of the switch units is composed of a MOS transistor.

The invention claimed in claim 7 provides the photoelectric conversion device claimed in any one of claims 1 to 5, in which the fourth switch unit includes: a first MOS transistor selectively applying a reference voltage to the first accumulating unit; a second MOS transistor selectively applying a reference voltage to the second accumulating unit; and a third MOS transistor that connects the connection point between the first accumulating unit and the first MOS transistor to the connection point between the second accumulating unit and the second MOS transistor.

(Effect) According to the invention, an output circuit is configured to inverse the polarity of the first accumulating unit accumulating the noise signal component, derives an output signal from the difference between the first accumulating unit and the second accumulating unit accumulating the optical signal component according to the incident light, and outputs the output signal to an output line. Therefore, it is unnecessary to configure a circuit such as a differential amplifier and so on, and thus the system configuration is simplified, thereby capable of reducing the number of elements and the layout area. Further, it is possible to remove the noise signal component in each pixel unit.

REFERENCE NUMERALS

1 PHOTOELECTRIC CONVERSION ELEMENT
3 BUFFER AMPLIFIER
4 FIRST SWITCH UNIT
5 SECOND SWITCH UNIT
6 FIRST ACCUMULATING UNIT
7 SECOND ACCUMULATING UNIT
8 THIRD SWITCH UNIT
9 FOURTH SWITCH UNIT
9a FIRST MOS TRANSISTOR
9b SECOND MOS TRANSISTOR
9c THIRD MOS TRANSISTOR
10 FIFTH SWITCH UNIT

BEST MODE FOR CARRYING OUT THE INVENTION

Figure 1:
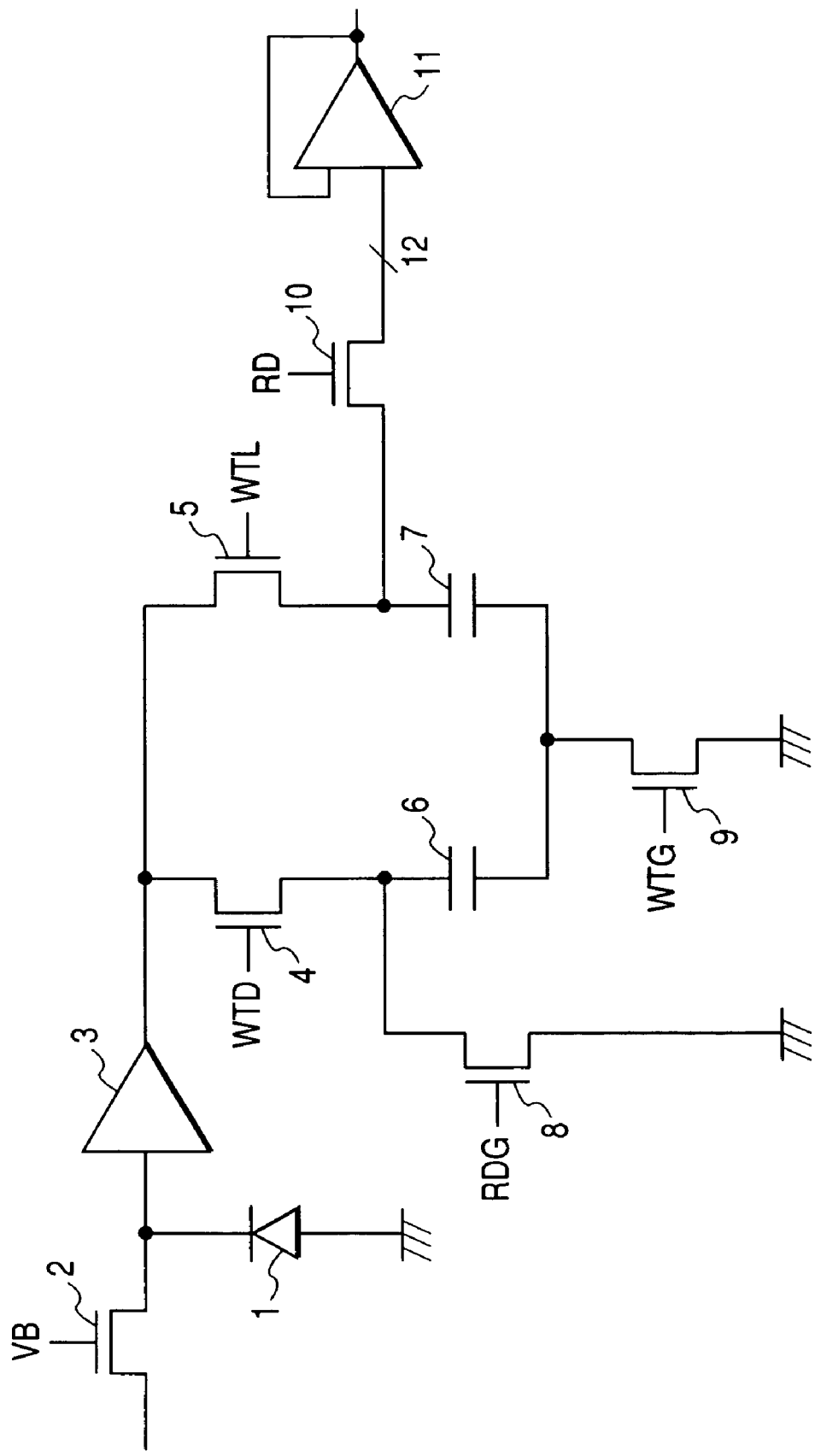
FIG. 1 is a circuit diagram illustrating a photoelectric conversion device according to a first embodiment of the invention.

FIG. 1 is a circuit diagram illustrating a first embodiment of the invention. A photoelectric conversion element 1 composed of a photodiode is provided in each pixel unit. The photoelectric conversion element 1 is connected to a buffer amplifier 3. The buffer amplifier 3 is connected to the sources of first and second switch units 4 and 5 each composed of a MOS transistor. The drain of the first switch unit 4 composed of a MOS transistor is connected to a first accumulating unit 6 composed of a capacitor or the like, and the first accumulating unit 6 accumulates noise signals from the photoelectric conversion element 1. The connection point between the first switch unit 4 composed of a MOS transistor and the first accumulating unit is grounded through a third switch unit 8 composed of a MOS transistor. Further, the drain of the second switch unit 5 composed of a MOS transistor is connected to a second accumulating unit 7 composed of a capacitor or the like, and the second accumulating unit 7 accumulates noise signals from the photoelectric conversion element 1. Each switch unit is not limited to a MOS transistor but may be composed of a bipolar transistor.

A source of a fifth switch unit 10 composed of a MOS transistor is connected to the connection point between the second switch unit 5 and the second accumulating unit 7, and a drain of the fifth switch unit 10 is connected to the buffer amplifier 11. A source of a fourth switch unit 9 composed of a MOS transistor is connected to the connection point between the first accumulating unit 6 and the second accumulating unit 7, and a drain of the fourth switch unit 9 is grounded. A bias voltage is applied to the photoelectric conversion element 1 through a switch unit 2 composed of a MOS transistor.

Figure 2:
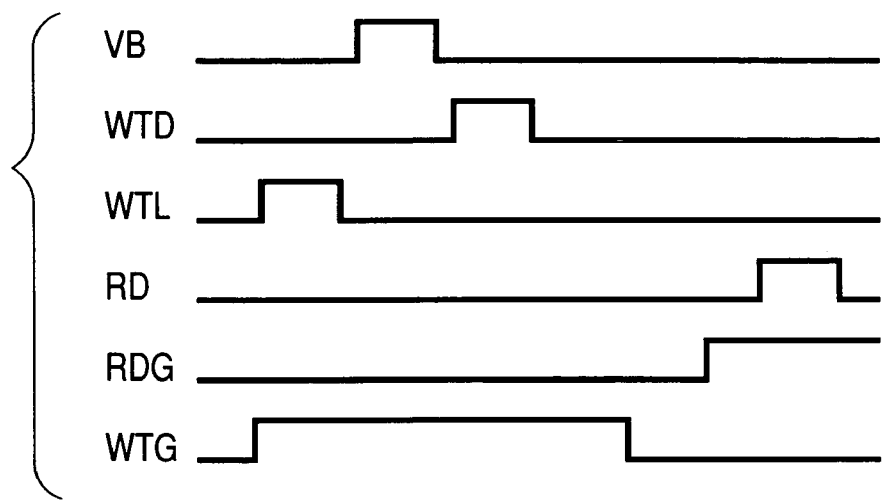
FIG. 2 is a timing chart illustrating the photoelectric conversion device according to the first embodiment of the invention.

FIG. 2 is a timing chart illustrating the first embodiment of the invention and illustrates the operation and the configuration of the first embodiment.

First, when driving pulses WTL and WTG to be applied to the gates of the MOS transistors are turned on (Step 1), light is incident onto the photoelectric conversion element 1 so as to generate an optical signal and the optical signal is accumulated in the second accumulating unit 7 within an arbitrary period (Step 2). Subsequently, when the driving pulse WTL is turned off and a driving pulse VB is turned on, a bias voltage is applied to refresh the photoelectric conversion element 1 (Step 3). Directly after the refresh operation, when a driving pulse WTD is turned on, a noise signal is accumulated in the first accumulating unit 6 within an arbitrary period (Step 4). At this time, the first and second accumulating units 6 and 7 have the accumulated noise signal and the accumulated optical signal, respectively. The application time period of the driving pulse WTD applied to the MOS transistor 4 (noise signal accumulating period) and the application time period of the driving pulse WTL applied to the MOS transistor 5 (optical signal accumulating period) are preferably set to be almost the same in order to precisely obtain a net signal by removing a noise signal component from an optical signal component.

Then, when the driving pulse WTG is turned off (Step 5) and a driving pulse RDG is turned on (Step 6), the polarity of the first accumulating unit 6 is inversed. When the varied polarity is added to the polarity of the second accumulating unit 7, the voltage corresponding to the noise signal component accumulated in the first accumulating unit 6 is subtracted from the voltage corresponding to the optical signal component accumulated in the second accumulating unit 7, thereby removing the noise signal component. Further, when a driving pulse RD is turned on, a net optical signal without noise signal component is obtained (Step 7).

It is assumed that the potential value of the noise signal component, which is accumulated in the first accumulating unit 6 at step 2, in respect to a reference voltage is +Vd and the potential value of the optical signal component, which is accumulated in the second accumulating unit at step 4, is +VL. The accumulating units 6 and 7 are directly connected to each other after steps 5 and 6. Therefore, the polarity of the accumulating unit 6 becomes −VD and the potential of the connection point between the second switch unit and the accumulating unit 7 becomes (VL−VD). Next, at step 7, when the driving pulse RD is turned on, the voltage (VL−VD) is applied to the buffer amplifier 11. Therefore, the noise signal component is removed from the optical signal component and thus a net signal is output.

Figure 3:
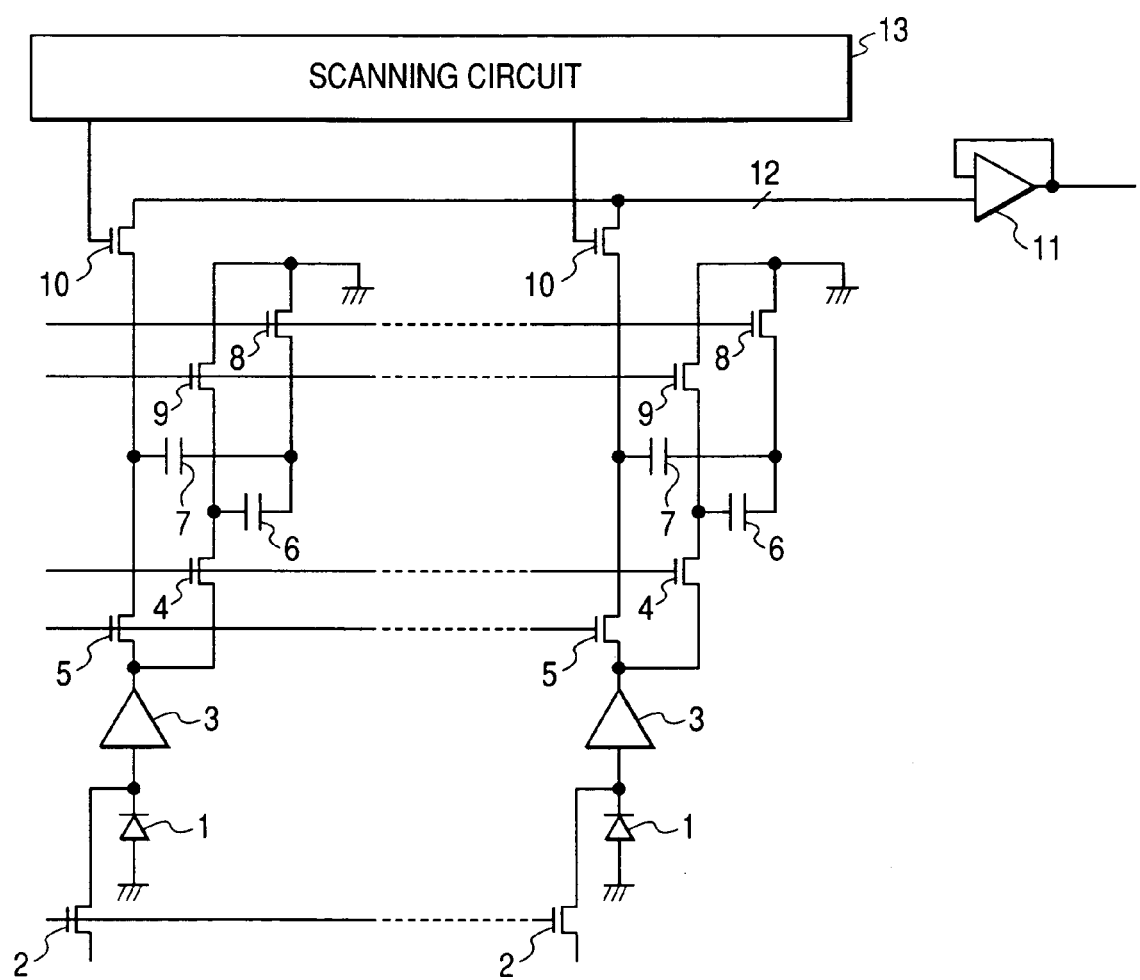
FIG. 3 is a circuit configuration diagram showing a photoelectric conversion device according to the first embodiment of the invention in which a plurality of pixels are two-dimensionally arranged.

FIG. 3 shows a two-dimensional basic pixel structure of photoelectric conversion device. The fifth switch units 10, each composed of a MOS transistor, are sequentially turned on by a scanning circuit 13 such as a shift register such that signals are outcoming from individual pixels by the driving pulse RD. The output signal sequentially output is sent to the buffer amplifier 11 through a common output line 12.

Figure 4:
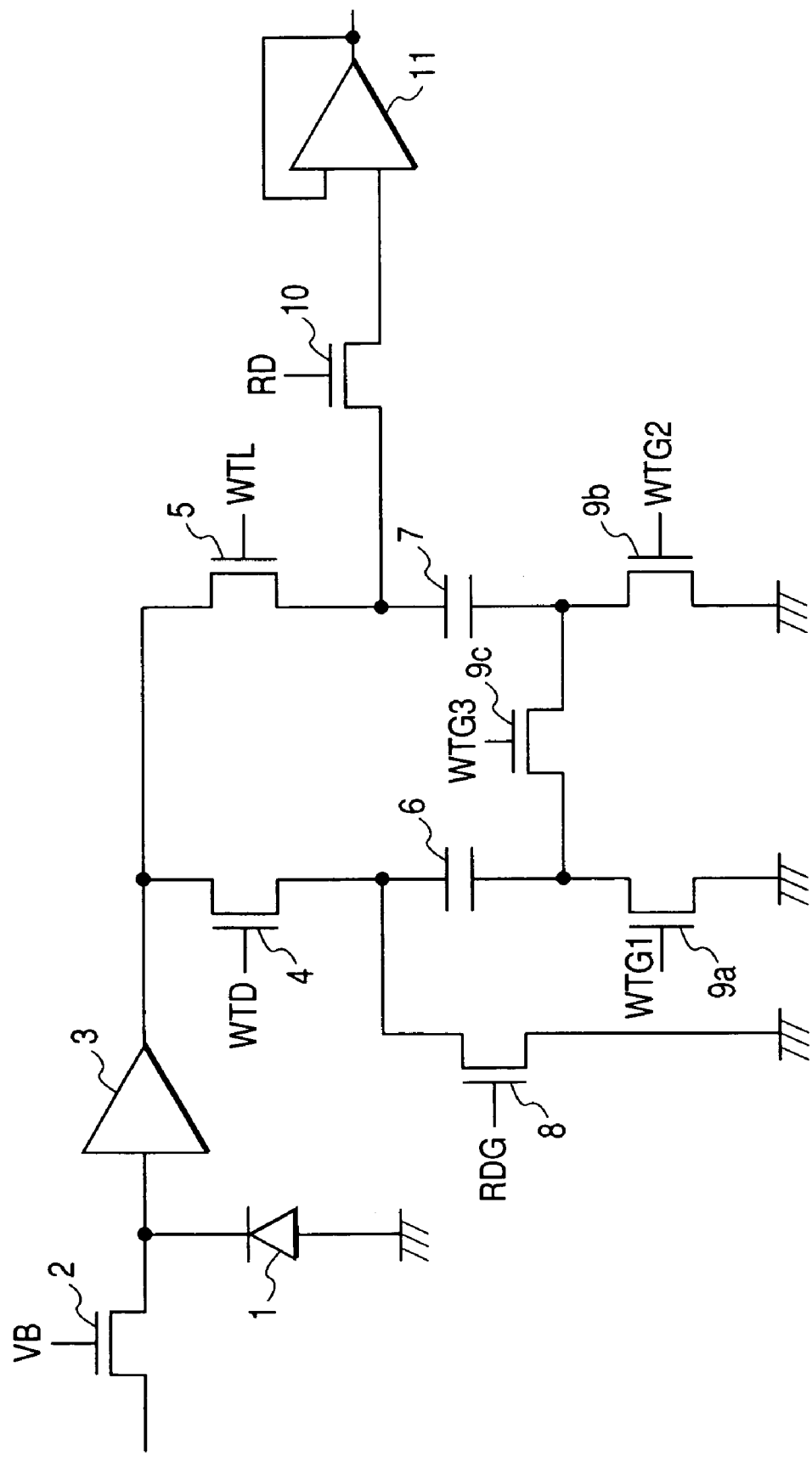
FIG. 4 is a circuit diagram illustrating a photoelectric conversion device according to a second embodiment of the invention.
Figure 5:
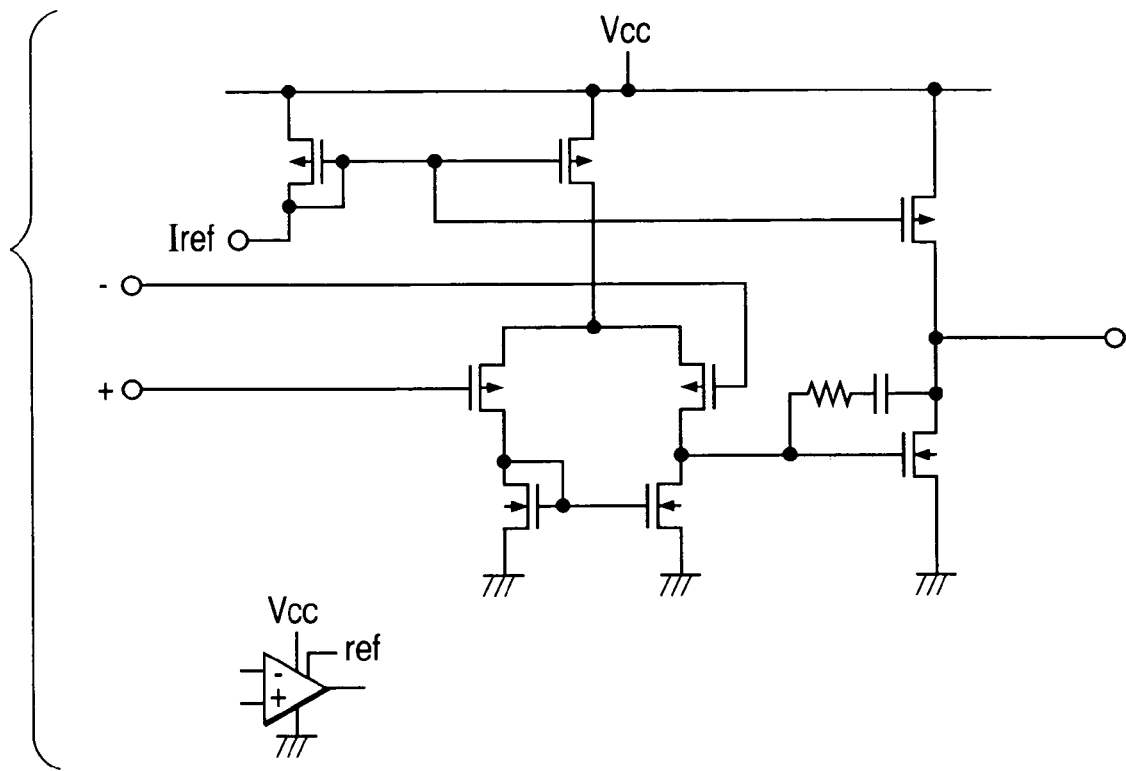
FIG. 5 is a circuit diagram showing the basic configuration of a differential amplifier.
Figure 6:
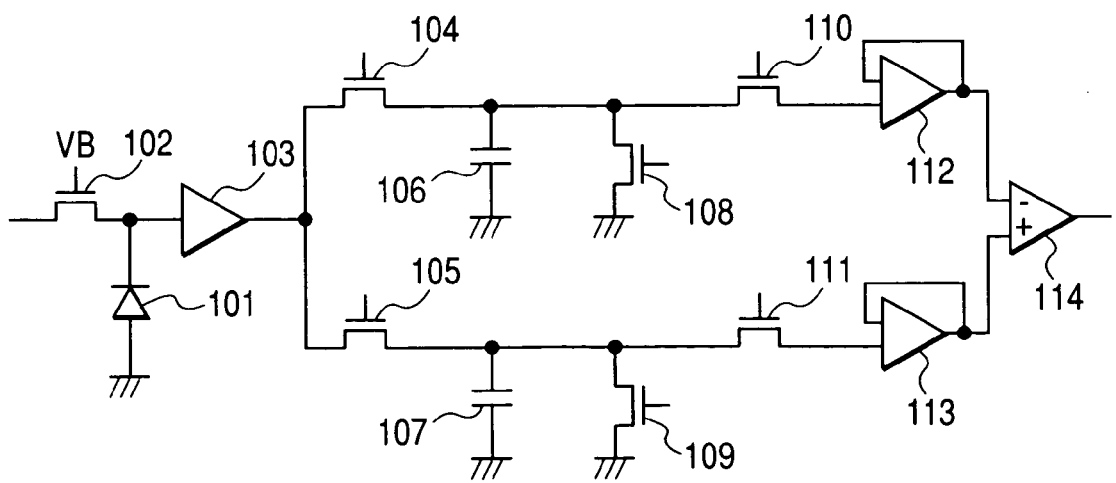
FIG. 6 is a circuit diagram illustrating a photoelectric conversion device according to the related art.

FIG. 4 is a circuit diagram illustrating a second embodiment of the invention. The fourth switch unit is composed of three MOS transistors unlike that in the first embodiment. A first MOS transistor 9a selectively applies the reference voltage to the first accumulating unit 6, and a second MOS transistor selectively applies the reference voltage to the second accumulating unit 7. In regards to a third MOS transistor, the source of the third MOS transistor 9c is connected to the connection point between the first accumulating unit 6 and the second MOS transistor 9b and the drain of the third MOS transistor 9c is connected to the connection point between the second accumulating unit 7 and the second MOS transistor.

The operation in the second embodiment will be described (the timing chart is not shown). Basically, the operation follows the timing chart of FIG. 2 in the first embodiment. However, when a driving pulse WGT1 is turned on, a noise signal component is accumulated in the first accumulating unit 6, and when a driving pulse WGT2 is turned on, an optical signal component is accumulated in the second accumulating unit 7. Further, when the driving pulses WGT1 and WGT2 are turned off, the driving pulse RDG is turned on, and then a driving pulse WGT3 is turned on, the noise signal component of the first accumulating unit 6 is removed.

At this time, the photoelectric conversion element 1 is composed of a photodiode 1 but may be an element formed by a combination of a capacitor and a bipolar transistor. In this case, charge, which is generated by light that is incident onto the base of the bipolar transistor, is accumulated and current between the emitter electrode and the collector electrode is controlled by the charge amount. Further, when a pulse is applied to the capacitor electrode, a refresh operation is performed.

The reference voltage in the first and second embodiment is set to a ground voltage but may be set to a variable voltage (not shown). This is available in a case in which parasitic capacitance, generated when the first and second switch units 4 and 5 are transistors, can be disregarded. The first accumulating unit 6 has noise which is an origin of the parasitic capacitance as well as a dark voltage noise signal component, and the second accumulating unit 7 has noise which is an origin of the parasitic capacitance as well as the optical signal component. Therefore, it is preferable to set the variable voltage to an arbitrary value so as to remove the voltage which is the origin of the parasitic capacitance. Further, a circuit for removing the noise that is the origin of the parasitic capacitance may be configured.

In the description of the invention, the optical signal component is first accumulated but the noise signal component may be first accumulated so as to remove the noise signal component. Further, a configuration in which the first accumulating unit 6 is used for accumulating the optical signal component, and the second accumulating unit 7 is used for accumulating the noise signal component can be realized by only inverting the positive and the negative of the potential.

The invention has been described in detail in reference to the above embodiments but it will be understood by those skilled in the art that various modifications and changes can be made without departing from the spirit and scope of the invention.

This application is based on Japanese Patent Application No. 2003-307706 filed in the Japanese Patent Office on 29th day of Aug. 2003 and refers to the context of Japanese Patent Application No. 2003-307706 herein.

INDUSTRIAL APPLICABILITY

According to the invention, since it is unnecessary to configure a circuit such as a differential amplifier or an extra buffer amplifier, it is possible to simplify the system configuration and to reduce the number of elements and the layout area. Further, since two amplifiers, that is, a buffer amplifier for dark voltage noise and a buffer amplifier for an optical signal are not required, it is possible to further reduce the area. Furthermore, since a problem does not occur when the dark voltage noise component is not effectively removed due to occurrence of variation in the output voltage, it is possible to read an exact signal.

The invention claimed is:

1. A photoelectric conversion device comprising:
a photoelectric conversion element;
a first accumulating unit that accumulates an output signal outcoming from the photoelectric conversion element during a first period;
a second accumulating unit that accumulates an output signal outcoming from the photoelectric conversion element during a second period different from the first period;
first and second switch units used for selectively introducing the output signal from the photoelectric conversion element to the first or second accumulating unit; and
an output unit that outputs the output signals from the photoelectric conversion element accumulated in the first and second accumulating units at the same time by inversing the polarity of the first accumulating unit.

2. The photoelectric conversion device according to claim 1,
wherein the output unit includes:
a third switch unit selectively applying a reference voltage to the connection point between the first switch unit and the first accumulating unit;
a fourth switch unit selectively applying a reference voltage to the first and second accumulating units; and
a fifth switch unit that is connected to the connection point between the second accumulating unit and the second switch unit so as to read out signals from the first and second accumulating units.

3. A photoelectric conversion device comprising:
a photoelectric conversion element;
a first accumulating unit that accumulates an output signal outcoming from the photoelectric conversion element during a first period;
a second accumulating unit that accumulates an output signal outcoming from the photoelectric conversion element during a second period different from the first period;
first and second switch units used for selectively introducing the output signal from the photoelectric conversion element to the first or second accumulating unit;
a third switch unit selectively applying a reference voltage to the connection point between the first switch unit and the first accumulating unit;
a fourth switch unit selectively applying a reference voltage to the first and second accumulating units; and
a fifth switch unit that is connected to the connection point between the second accumulating unit and the second switch unit so as to read out signals from the first and second accumulating units.

4. A photoelectric conversion device comprising:
a photoelectric conversion element;
a first accumulating unit that accumulates an output signal outcoming from the photoelectric conversion element during a first period;
a second accumulating unit that accumulates an output signal outcoming from the photoelectric conversion element during a second period different from the first period;
first and second switch units used for selectively introducing the output signal from the photoelectric conversion element to the first or second accumulating unit;
a third switch unit selectively applying a reference voltage to the first accumulating unit when reading;
a fourth switch unit selectively applying a reference voltage to the first and second accumulating units when the output signal from the photoelectric conversion element is accumulated; and
a fifth switch unit that outputs output signals from the first and second accumulating units at the same time at the time of reading.

5. A photoelectric conversion device comprising:
a plurality of photoelectric conversion elements, each forming a pixel, arranged in a matrix;
first accumulating units that accumulate output signals outcoming from the photoelectric conversion elements during a first period;
second accumulating units that accumulate output signals outcoming from the photoelectric conversion elements during a second period different from the first period;
first and second switch units used for selectively introducing the output signals from the photoelectric conversion elements to the first or second accumulating units;
third switch units selectively applying a reference voltage to the first accumulating units when reading;
fourth switch units selectively applying a reference voltage to the first and second accumulating units when the signals from the photoelectric conversion elements are accumulated; and
fifth switch units that output signals from the first and second accumulating units at the same time at the time of reading,
wherein noise is removed for each pixel.

6. The photoelectric conversion device according to any one of claims 1 to 5,
wherein each of the switch units is composed of a MOS transistor.

7. The photoelectric conversion device according to any one of claims 1 to 5,
wherein the fourth switch unit includes:
a first MOS transistor selectively applying a reference voltage to the first accumulating unit;
a second MOS transistor selectively applying a reference voltage to the second accumulating unit; and
a third MOS transistor that connects the connection point between the first accumulating unit and the first MOS transistor to the connection point between the second accumulating unit and the second MOS transistor.

* * * * *